United States Patent [19]

Moran

[11] Patent Number: 4,654,591
[45] Date of Patent: Mar. 31, 1987

[54] NMR FLOW IMAGING USING BI-PHASIC EXCITATION FIELD GRADIENTS

[75] Inventor: Paul R. Moran, Winston-Salem, N.C.

[73] Assignee: Wisconsin Alumni Research Foundation, Madison, Wis.

[21] Appl. No.: 760,354

[22] Filed: Jul. 29, 1985

[51] Int. Cl.[4] ............................................ G01R 33/20
[52] U.S. Cl. ...................................... 324/306; 324/309
[58] Field of Search ............... 128/653; 324/300, 306, 324/307, 309, 311, 313, 318, 322

[56] References Cited

U.S. PATENT DOCUMENTS

| | | | |
|---|---|---|---|
| 4,516,075 | 5/1985 | Moran | 324/309 |
| 4,523,596 | 6/1985 | Macovski | 324/309 |
| 4,528,985 | 7/1985 | Macovski | 128/653 |
| 4,565,968 | 1/1986 | Macovski | 324/306 |
| 4,595,879 | 1/1986 | Lent et al. | 324/309 |
| 4,602,641 | 7/1986 | Feinberg | 128/653 |

Primary Examiner—Michael J. Tokar
Attorney, Agent, or Firm—Barry E. Sammons

[57] ABSTRACT

An NMR zeugmatographic scanner is modified to provide flow images. A motion sensitizing, bi-phasic excitation field gradient is applied during each measurement cycle to produce transverse magnetization in paramagnetic nuclei which are moving in the direction of the gradient. The resulting free induction signal is processed using an inverse Fourier transformation to produce images of flowing paramagnetic nuclei.

7 Claims, 10 Drawing Figures

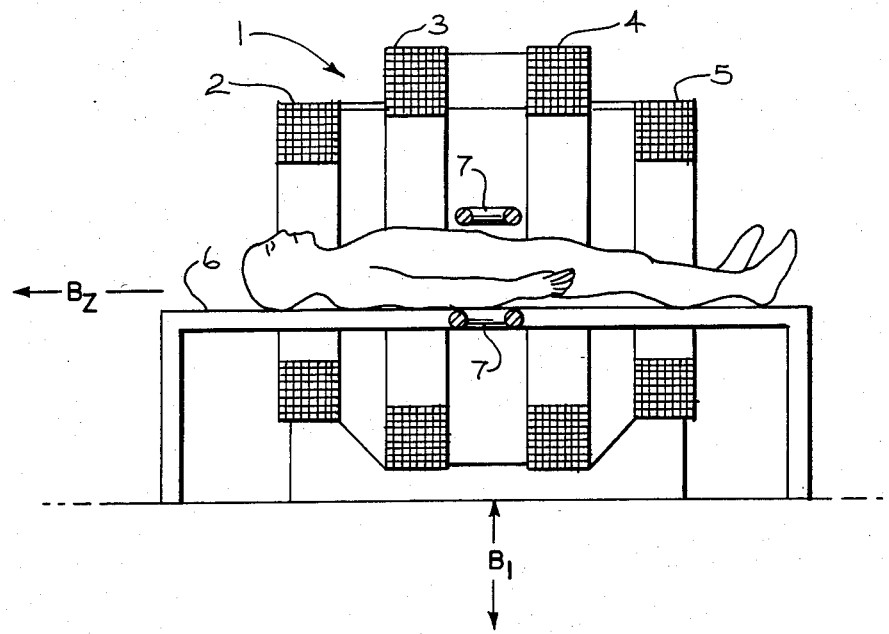
FIG. 1
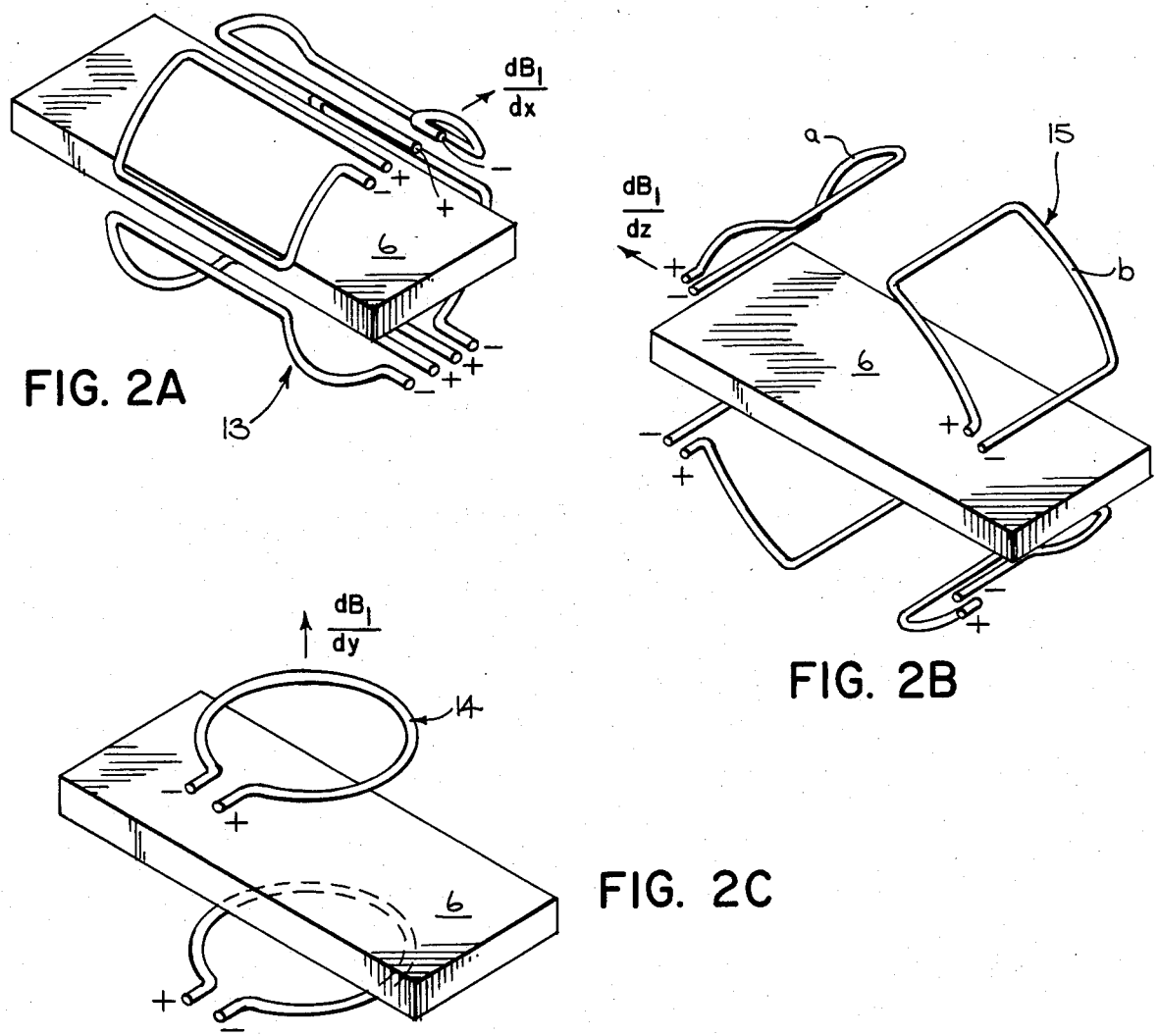
FIG. 2A
FIG. 2B
FIG. 2C

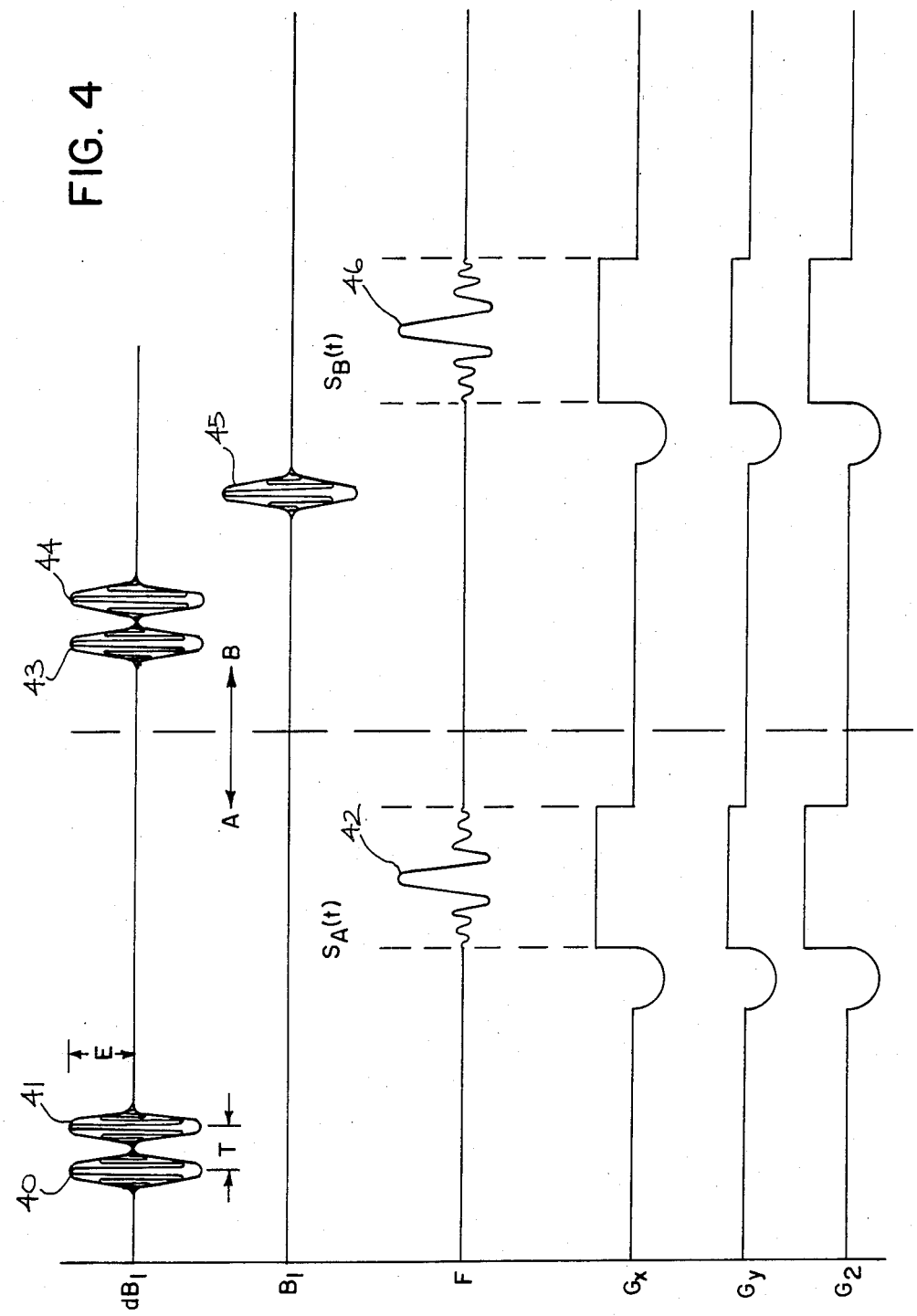

NMR FLOW IMAGING USING BI-PHASIC EXCITATION FIELD GRADIENTS

BACKGROUND OF THE INVENTION

The field of the invention is gyromagnetic resonance spectroscopy, and particularly, nuclear magnetic resonance (NMR) techniques for measuring the properties of materials.

Gyromagnetic resonance spectroscopy is conducted to study nuclei that have magnetic moments and electrons which are in a paramagnetic state. The former is referred to in the art as nuclear magnetic resonance (NMR), and the latter is referred to as paramagnetic resonance (EPR) or electron spin resonance (ESR). There are other forms of gyromagnetic spectroscopy that are practiced less frequently, but are also included in the field of this invention.

Any nucleas which possesses a magnetic moment attempts to align itself with the direction of the magnetic field in which is it located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus).

When a substance such as human tissue is subjected to a uniform magnetic field (polarizing field $B_0$) the individual magnetic moments of the paramagnetic nuclei in the tissue atttempt to align with this field, but precess about it in random order at their characteristic Larmor frequency. A net magnetic moment $M_z$ is produced in the direction of the polarizing field, but the randomly oriented components in the perpendicular plane (x-y plane) cancel one another. If, however, the substance, or tissue, is irradiated with a magnetic field (excitation field $B_1$) which is in the x-y plane and which is near the Larmor frequency, the net aligned moment, $M_z$, can be rotated into the x-y plane to produce a net transverse magnetic moment $M_1$ which is rotating in the x-y plane at the Larmor frequency.

The practical value of this gyromagnetic phenomena resides in the radio signal which is emitted after the excitation signal $B_1$ is terminated. When the excitation signal is removed, an oscillating sine wave is induced in a receiving coil by the rotating field produced by the transverse magnetic moment $M_1$. The frequency of this signal is the Larmor frequency, and its initial amplitude, $A_0$, is determined by the magnitude of $M_1$. The amplitude A of the emission signal (in simple systems) decays in an exponential fashion with time, t:

$$A = A_0 e^{-t/T_2}$$

The decay constant $1/T_2$ is a characteristic of the process and it provides valuable information about the substance under study. The time constant $T_2$ is referred to as the "spin-spin relaxation" constant, or the "transverse relaxation" constant, and it measures the rate at which the aligned precession of the nuclei dephase after removal of the excitation signal $B_1$.

Other factors contribute to the amplitude of the free induction decay (FID) signal which is defined by the $T_2$ spin-spin relaxation process. One of these is referred to as the spin-lattice relaxation process which is characterized by the time constant $T_1$. This is also called the longitudinal relaxation process as it describes the recovery of the net magnetic moment M to its equilibrium value $M_0$ along the axis of magnetic polarization (Z). The $T_1$ time constant is longer than $T_2$, much longer in most substances, and its independent measurement is the subject of many gyromagnetic procedures.

The measurements described above are called "pulsed NMR measurements." They are divided into a period of excitation and a period of emission. As will be discussed in more detail below, this measurement cycle may be repeated many times to accumulate different data during each cycle or to make the same measurement at different locations in the subject. A variety of preparative excitation techniques are known which involve the application of one or more excitation pulses of varying duration. Such preparative excitation techniques are employed to "sensitize" the subsequently observed free induction decay signal (FID) to a particular phenomenon. Some of these excitation techniques are disclosed in U.S. Pat. Nos. 4,339,716; 4,345,207; 4,201,726; 4,115,730 and 3,474,329.

Although NMR measurements are useful in many scientific and engineering fields, their potential use in the field of medicine is enormous. NMR measurements provide a contrast mechanism which is quite different from x-rays, and this enables differences between soft tissues to be observed with NMR which are completely indiscernible with x-rays. In addition, physiological differences can be observed with NMR measurements, whereas x-rays are limited primarily to anatomical studies.

For most medical applications utilizing NMR, an imaging technique must be employed to obtain gyromagnetic information at specific locations in the subject. The foremost NMR imaging technique is referred to as "zeugmatography" and was first proposed by P. C. Lauterbur in a publication "Image Formation by Induced Local Interactions: Examples Employing Nuclear Magnetic Resonance", Nature, Vol. 242, Mar. 16, 1973, pp. 190-191. Zeugmatography employs one or more additional magnetic fields which have the same direction as the polarizing field $B_0$, but which have a nonzero gradient. By varying the strength (G) of these gradients, the net strength of the polarizing field $B_0 = B_z + G_x X + G_y Y + G_z Z$ at any location can be varied. As a result, if the frequency response of the FID receiver coil and circuitry is narrowed to respond to a single frequency, $\omega_0$, then gyromagnetic phenomena will be observed only at a location where the net polarizing field $B_0$ is of the proper strength to satisfy the Larmor equation; $\omega_0 = \gamma B_0$: where $\omega_0$ is the Larmor frequency at that location.

By "linking" the resulting free induction signal FID with the strengths of the gradients $(G = G_x, G_y, G_z)$ at the moment the signal is generated, the NMR signal is "tagged", or "sensitized", with position information. Such position sensitizing of the NMR signal enables an NMR image to be produced by a series of measurements. Such NMR imaging methods have been classified as point methods, line methods, plane methods and three dimensional methods. These are discussed, for example, by P. Mansfield and P. G. Morris in their book "NMR Imaging in Biomedicine" published in 1982 by Academic Press, New York.

The NMR scanners which implement these techniques are constructed in a variety of sizes. Small, specially designed machines, are employed to examine laboratory animals or to provide images of specific parts of the human body. On the other hand, "whole body"

NMR scanners are sufficiently large to recieve an entire human body and produce an image of any portion thereof.

In my U.S. Pat. No. 4,516,075 I describe an NMR scanner which produces images indicative of the motion of the gyromagnetic material. This is accomplished by a motion sensitizing step which is interlaced with the normal pulsed NMR measurement cycles. More specifically, a bipolar magnetic field gradient is applied to the gyromagnetic material after the excitation period, but before the subsequent FID signal. The direction of this motion sensitizing magnetic field gradient determines the flow direction in which the subsequent FID signal is sensitized, and the magnitude of the motion in that direction is determined by measuring the phase of the transverse magnetic moment $M_1$. This phase is measured by detecting the component of the FID which is in phase with the excitation signal $B_1$ and by detecting the component which is in quadrature with the excitation signal $B_1$. These signals are digitized and processed along with position information to produce an image which is modulated in intensity as a function of the motion in the sensitized direction.

While this technique is very powerful and is very economical to implement in current NMR scanners, it is susceptible to visual "artifacts" caused by imperfections in the design or manufacture of the NMR scanner which produce phase errors at locations in the region of interest. For example, the excitation coils may introduce slight phase shifts in the excitation field $B_1$ at specific locations throughout the region of interest. Such phase shifts are detected and processed to indicate motion where, in fact, none actually occurred. While such artifacts can be reduced by properly designing the NMR scanner and by filtering out the known errors, such measures increase the complexity and cost of the system.

SUMMARY OF THE INVENTION

The present invention relates to an NMR imaging apparatus, and particularly, to a method and means for sensitizing the NMR signals to provide a motion image which is not subject to phase errors in the NMR scanner. More specifically, the present invention includes the application of a motion sensitizing field in the form of an excitation field gradient ($dB_1$) which generates the precessing gyromagnetic material to produce a net excited and precessing magnetic moment at each location in the region being imaged, and an opposed-phase excitation field gradient ($-dB_1$) which restores the net polarized magnetic moment, and thereby cancels the net precessing magnetic moment component of stationary gyromagnetic material at each of said locations. The net precessing magnetic moment of gyromagnetic material moving in the direction of the excitation field gradient is not cancelled by this bi-phasic sequence and it produces a subsequent FID signal. The amplitude of the FID signal is a measure of the amount of motion.

A general object of the invention is to measure the motion of gyromagnetic material at any location within a subject. Conventional NMR scanners may be easily modified to provide motion data along with other data collected during the NMR measurement cycle. Such modifications include the addition of excitation field gradient coils and associated control circuits which may be energized during each NMR measurement cycle to motion sensitize the FID signal. The same processing employed to produce images of gyromagnetic density from the FID signals may then be employed to construct a motion image.

Another object of the invention is to measure motion in any direction and at any position within the subject. A conventional zeugmatographic scanner capable of exciting a gyromagnetic response from a location within the subject is used to produce a motion sensitized response. Motion sensitization is accomplished with an excitation field gradient $dB_1$ of alternating phase which is applied for a portion of the measurement cycle. The direction of this motion sensitizing magnetic field is the same as the direction of the excitation field $B_1$, but its strength is graduated in the x, y and z directions to "tag" the flow data with a direction, as well as a magnitude and position.

Yet another object of the invention is to produce a FID signal which is indicative of gyromagnetic nuclei that are moving, but which is insensitive to stationary gyromagnetic material. Because of the bi-phasic nature of the excitation field gradient, any net magnetic moment produced in stationary gyromagnetic material by the first half of the excitation sequence is precisely nulled, or cancelled, by the second half of the excitation sequence. As a result, the stationary gyromagnetic material does not contribute to the subsequent FID signal. Of course, this motion measurement cycle can be interlaced with other, more conventional, measurement cycles which produce FID signals that indicate the density of stationary and moving gyromagnetic material.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 1 is a schematic elevation view of an NMR scanner which employs the present invention;

FIGS. 2A–2C are perspective views of the excitation field gradient coils which form part of the scanner of FIG. 1;

FIG. 4 is a graphic illustration of a typical measurement cycle performed according to the present invention;

DESCRIPTION OF THE PREFERRED EMBODIMENT

Although the present invention may be easily implemented in a variety of NMR scanner or NMR spectrometer structures, the preferred embodiment of the invention is a whole body NMR scanner which employs a large electromagnet to generate the polarizing field. Referring particularly to FIG. 1, this polarizing magnet 1 is comprised of four circular cylindrical segments 2–5 of sufficient size to receive a table 6. A patient may be placed on the table 6 and any portion of his body may be scanned by suitably positioning him with respect to excitation windings 7. The space between the windings 7 is referred to hereinafter as the "region of interest", since it is in this space that the various magnetic fields produced by the scanner have the proper homogeneity to produce accurate image data. The polarizing magnet 1 produces a strong magnetic field $B_z$ which is constant and homogeneous within the region of interest and the excitation windings 7 produce an excitation field $B_1$ which is in the transverse plane, perpendicular to the polarizing field $B_z$. The excitation field $B_1$ oscillates at a radio frequency $\omega_0$ and it may be applied as one or more pulses during each measurement cycle. The windings 7 are then switched to a passive mode in which they operate as receivers for the NMR signals produced in the patient's body.

Figure 3:
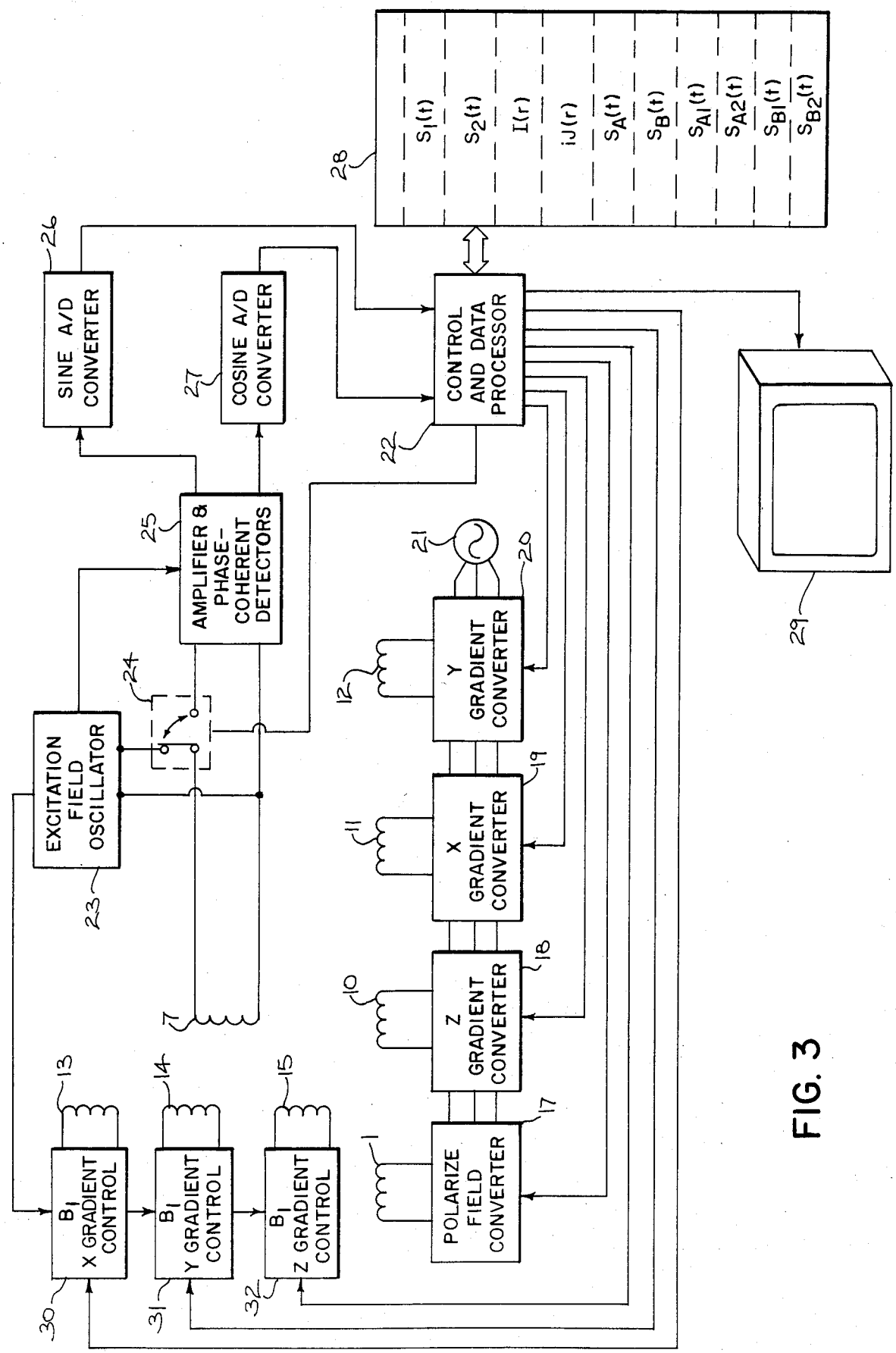
FIG. 3 is an electrical block diagram of the control system which forms part of the scanner of FIG. 1.

The NMR scanner has a number of other coils which are employed to position encode the FID signals and which are employed to practice the present invention. Referring particularly to FIG. 3, these include three sets of magnetic field gradient coils 10, 11 and 12 which produce magnetic fields that are directed along the z axis, but which have strengths that change as a function of position along the respective z, x and y axes. As explained in more detail in my U.S. Pat. No. 4,516,075, these gradient fields $G_z$, $G_x$ and $G_y$ are additive to the polarizing magnetic field $B_z$, and their strengths are controlled during each measurement cycle to position encode the FID signal which is produced. The generation and control of the polarizing magnetic field $B_z$ and the field gradients $G_x$, $G_y$ and $G_z$ is well-known in the art and is employed in existing commercially available NMR scanners.

Referring particularly to FIGS. 2 and 3, the present invention employs three sets of additional coils 13, 14 and 15 which produce magnetic fields at the Larmor frequency ($\omega_0$) and in the direction of the excitation field $B_1$. More specifically, the coil sets 13, 14 and 15 produce excitation field gradients $dB_x$, $dB_y$ and $dB_z$ which are additive to the excitation field $B_1$, but which have strengths that change as a function of position along the respective axes x, y and z. The vector sum of the excitation gradients $dB_x$, $dB_y$ and $dB_z$ is an excitation field gradient $dB_1$ which may be oriented in any direction by controlling the relative magnitude of its three components. As will be explained in more detail below, the orientation of this excitation field gradient $dB_1$, sensitizes the FID to motion in the same direction.

Referring particularly to FIG. 3 the control system for the NMR scanner includes a set of four static power converters 17–20 which connect to an a.c. power source 21. The static power converters 17–20 produce d.c. currents for the respective coils 10, 11 and 12 at levels determined by commands received from a processor 22. The polarity, or direction, of the d.c. currents produced for the gradient field coils 10–12 can also be controlled. Thus, both the magnitude and the direction of the gradient fields in the x, y and z direction can be switched on command from the processor 22.

The excitation winding 7 is driven by a radio frequency oscillator 23 when an electronic switch 24 is toggled to its active position. The switch 24 is controlled by the processor 22 and when the switch 24 is toggled to its passive position, the excitation winding 7 is coupled to the input of an amplifier and phase-coherent detector circuit 25. The NMR signals in the patient induce a voltage in the excitation winding 7 which is amplified and demodulated in the circuit 25. The oscillator 23 provides a reference signal to the circuit 25 that enables one phase-coherent detector therein to produce an in-phase, or sine, free induction decay (FID) signal to an analog-to-digital converter 26. A second phase-coherent detector produces an orthogonal, or cosine, FID signal to an analog-to-digital converter 27.

The free induction decay signals produced by the phase-coherent detector 25 are digitized by the A/D converters 26 and 27. The sample rate of this digitization is controlled by the processor 22, and the digital numbers which are produced by the A/D converters 26 and 27 are input to the processor 22 and stored in a memory 28. The processor 22 also stores values indicative of the gradient field strengths at the moment the FID signals are produced, and in this manner, the FID signals are linked to a specific position and motion direction within the patient.

To practice the present invention the elements of the NMR scanner described above are operated in a series of measurement cycles in which the FID produced during each measurement cycle is sensitized to flow. This sensitization is carried out in part by applying an excitation field gradient $dB_1$ during each measurement cycle. As shown in FIG. 3, this field $dB_1$ is produced by the excitation gradient coils 13–15 that are driven by respective control circuits 30–32 and which are operated by the processor 22. Each control circuit 30–32 receives the excitation signal from the oscillator 23 and the amplitude thereof is controlled separately in each to produce the desired excitation gradient field $dB_1 = dB_x + dB_y + dB_z$. The control circuits 30–32 also include switches that enable the excitation signals applied to the coils 13–15 to be reversed in polarity (i.e. 180 degree phase shift). Both the magnitude and the direction of the excitation gradient field $dB_1$ are thus under the control of the processor 22 and may be changed during each measurement cycle.

The present invention is implemented by controlling the above-described elements to perform a two-part measurement cycle depicted in FIG. 4. More specifically, during part A of each measurement cycle the motion sensitizing is accomplished by two bursts, of excitation field gradient energy $dB_1$, as indicated by the two pulses 40 and 41. The magnitude of these excitation field gradient pulses will, of course, be different at locations throughout the region of interest. The two excitation field gradient pulses 40 and 41 are identical in frequency, duration and strength, but they are 180 degrees out of phase with each other. As a result, at any physical position in the region of interest the precessing paramagnetic nuclei are oriented by the first signal 40 to produce a transverse magntic moment $M_1$ which is a function of the strength of the excitation field $B_1$ at that point. Assuming the paramagnetic nuclei are stationary, when the second, phase reversed pulse 41 is subsequently applied, the aligned, precessing nuclei are totally re-oriented and the transverse magnetic moment $M_1$ at each physical position is reduced to zero.

When there is motion in the direction of the excitation field gradient $dB_1$, however, the oriented, precessing nuclei move to a different location during the time period of the two pulses 40 and 41, and they "see" a second pulse 41 having a different magnitude. As a result, the second signal 41 does not completely re-orient the precessing nuclei and a net transverse magnetic moment $M_1$ remains. The magnitude of this net transverse magnetic moment $M_1$ is a function of the density of the paramagnetic nuclei moving in the sensitized direction and the velocity of that movement. Because the density is relatively uniform in anatomical fluids such as blood, this magnitude is predominantly a function of velocity alone. The resulting free induction decay (FID) signal 42 is received by the winding 7 when the appropriate magnetic field gradients $G_x$, $G_y$ and $G_z$ are applied. This FID signal produced during part A of the cycle is detected and digitized as a data file $S_A(t)=S_{A1}(t)+iS_{A2}(t)$.

To provide the complete data set which enables one to determine the distribution of the velocity at each physical location, part B of the measurement cycle is performed. Referring still to FIG. 4, this part of the measurement cycle is started with two "bi-phasic" excitation field gradient pulses 43 and 44. These are similar to the pulses 40 and 41 and are produced by the coils 13-15. This is followed by a conventional excitation field pulse 45 which is produced by the excitation coil 7. The excitation pulse 45 produces a uniform field throughout the region of interest and its magnitude and duration are such that the net magnetic moment M is rotated, or "tipped", ninety degrees throughout the region. The FID signal 46 is then produced when the magnetic field gradients $G_x$, $G_y$ and $G_z$ are applied. This signal 46 is detected, digitized and stored as a data file $S_B(t)=S_{B1}(t)+iS_{B2}(t)$. Thus, part A and part B are two sub-cycles which combine to give a complete velocity-distribution cycle of measurement.

The data files $S_A(t)$ and $S_B(t)$ depend also upon the strength and timing of the bi-phasic excitation field gradient pulses. Referring to FIG. 4, the time integral of the field strength of each pulse 40, 41, 43 and 44 is denoted as "E" and the time interval between the center of each bi-phasic pulse in the pairs 40-41 and 43-44 is denoted as "T". The product, ET, is the velocity sensitization factor which is denoted as "u" and is measured in units of sec/cm. The quantity "u" is a controlled variable in each NMR measurement cycle and the data files $S_A(t)$ and $S_B(t)$ may properly be expressed as a function of two variables:

$$S_A(u,t)=S_{A1}(u,t)+iS_{A2}(u,t)$$

$$S_B(u,t)=S_{B1}(u,t)+iS_{B2}(u,t)$$

The controlled variable "u" is the velocity encoding variable, whereas the variable "t" is the spatial-position encoding variable. For notational simplicity, however, the variable "u" is an implicit, unwritten variable in the following discussion.

Images may be reconstructed from the data files $S_A(t)$ and $S_B(t)$ which employ both the spatial-position encoded information and the velocity distribution encoded information. A multi-dimensional Fourier transform is employed for this reconstruction, and because this transform is linearly additive with respect to the encoded variables "u" and "t", it makes no difference which image is reconstructed first. In the following description the spatial-position information is reconstructed first and then the velocity distribution information is reconstructed.

The spatial-position information can be extracted and used to produce an image using the processing technique described in my U.S. Pat. No. 4,516,075. More specifically, a data file S(t) is created, where:

$$S(t)=S_1(t)+iS_2(t) \quad (1)$$

$$S_1(t)=[S_{B1}(t)-S_{A2}(t)]$$

$$S_2(t)=[S_{B2}(t)+S_{A1}(t)]$$

This may be written as the spectral transform:

$$S(t)=K\int m(w)e^{iwt}dw, \quad (2)$$

$$w=w(Larmor)-w_{rf},$$

and K is a constant electronic conversion factor. This signal has been spacially modulated by the field gradient $(G=G_xx+G_yy+G_zz)$ and is equivalent to the following:

$$S(t)=\int M_1(r)e^{-2\pi i\gamma G\cdot r t}dr \quad (3)$$

where:
$M_1$ = transverse magnetization
r = a position (x, y, z)
$\gamma$ = magnetogyric constant.
This can be expressed in "q" space as:

$$S(q)=K\int M_1(r)e^{-2\pi iq\cdot r}dr \quad (4)$$

where: "q" is a position in three-dimensional space which is determined by the field gradient G, $q=\gamma Gt$.

Each measurement cycle thus produces a line sampling in q-space, and the data files $S_1(t)$ and $S_2(t)$ represent a set of such line samplings. An image $I_m(r)$ can be reconstructed from this data by performing a numerical discrete Fourier inversion to the desired geometry:

$$I_m(r)=K\int H(q)S(q)e^{2\pi iq\cdot r}dq \quad (5)$$

where: H(q) is the apodizing function associated with the digitizing process.

When the Fourier inversion is performed according to equation (5) by the processor 22, two data files are created, I(r) and iJ(r), where:

$$I_m(r)=I(r)+iJ(r). \quad (6)$$

The image data in the file $I_m(r)$ may be output to a display device, such as the CRT 29 in FIG. 3, to produce an image.

If no bi-phasic excitation field gradient ($dB_1$) is applied (i.e. u=0), then the resulting image does not contain velocity information. In such case, the $S_A(t)$ data file is zero and the $S_B(t)$ data file contains solely density data which results from the conventional excitation pulse 45. The image data may then be expressed as follows:

$$I_M(r)=I_B(r)+iJ_B(r) \quad (7)$$

When the bi-phasic excitation field gradient pulses 40, 41, 43 and 44 are applied (i.e. $u\neq 0$), then the data files $S_A(t)$ and $S_B(t)$ contain data which is dependent on the value of u. In such case, the image data may be expressed as follows:

$$I_M(u,r)=(I_B(r)-J_A(r))+i(J_B(r)+I_A(r)) \quad (8)$$

To provide an image data file which indicates the density of paramagnetic nuclei traveling at velocity "v" at each spatial position "r", a set of measurement cycles are conducted in which the value of u is incremented through a range in integer steps, $$u=nU$$

where
n = 0, 1, 2, 3, ... N
U = incremental step which is smaller than the inverse of the maximum velocity occurring in the subject
N = number of intervals into which the velocity distribution is resolved.

An image data file can then be created by performing a Fourier Transform with respect to the variable "u".

$$I_v(r,v) = \int_{-NU}^{+NU} I_m(u,r)e^{iuv}du \quad (11)$$

The data file $I_v(r,v)$ is a multi-dimensional image array giving at position "r", the density of paramagnetic nuclei moving within an internal (1/NU) centered at velocity "v". The real and imaginary parts of this data file can be combined by the square root of the sum of the squares of the parts to provide image data which may be output to the CRT 29 (FIG. 3).

This image indicates by the intensity of each pixel on the CRT screen 29 the velocity of the gyromagnetic material at the position of the pixel. For example, the image may be a cross section through a patient's leg, with the motion sensitizing gradient $dB_1$ directed along the lengthwise dimension of the leg (Z axis). In such case the image produced on the CRT display 29 indicates the location of arteries and veins which are either darkened areas to indicate flow in one direction (-Z) or are brightened areas to indicate flow in the other direction (Z). The large mass of stationary gyromagnetic material in bones, muscle and other tissues appears gray. Similar images can be produced with the motion sensitizing gradient $dB_1$ oriented in other directions to detect blood flowing in those directions at selected locations in the patient.

The present invention offers a number of advantages over prior motion imaging techniques. First, only the moving gyromagnetic material produces a FID signal when the motion sensitizing sequence of the present invention is employed. This is in contrast to prior techniques in which flow information is imbedded in the FID signal as a small component which must be extracted from the much larger components produced by the stationary gyromagnetic material.

In addition, the motion information modulates the amplitude of the FID signal rather than its phase when the present invention is employed. Thus, when spurious phase errors are produced by the NMR scanner, they do not affect the quality of the flow images. As indicated above, such phase errors will return non-zero values in the sine phase-referenced components of the FID signals (i.e. $S_{A2}(t)$ and $S_{B2}(t)$). Such phase errors will not affect the images if the components are processed as described above in equations 1-11.

Figure 5A:
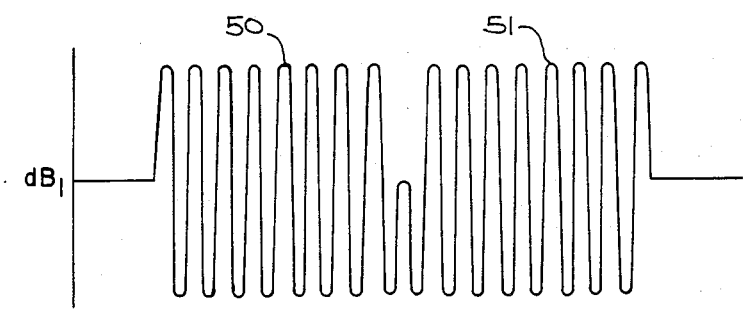
FIG. 5 is a graphic illustration of two motion sensitization sequences which may be employed in the measurement cycle of FIG. 4.
Figure 6A:
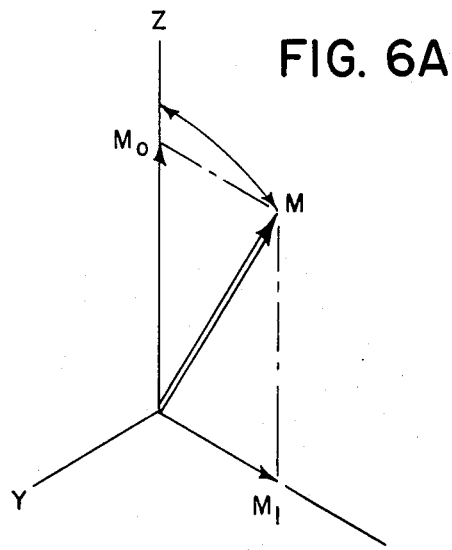
FIGS. 6A and 6B are vector diagrams employed to describe the motion sensitizing sequences of FIG. 5.

Referring particularly to FIGS. 5a and 6a, the motion sensitizing excitation field gradient comprises a first pulse 50 which "tips" the magnetic moment M of the precessing gyromagnetic material a predetermined amount from the z axis. The amount of such tip is different at positions along the direction of the excitation field gradient. The magnetic moment M is then tipped back to the z axis by the second excitation field gradient pulse 51, which is 180 degrees out of phase with the first pulse 50, but has the same duration and field strength throughout the region of interest. As indicated above, stationary gyromagnetic material "sees" the same amount of tipping and retipping excitation energy, and as a result, the net transverse magnetic moment $M_1$ is zero at the end of the two pulse sequence. Such a two pulse sequence of excitation field gradient energy is referred to herein as a bi-phasic motion sensitization field.

Figure 5B:
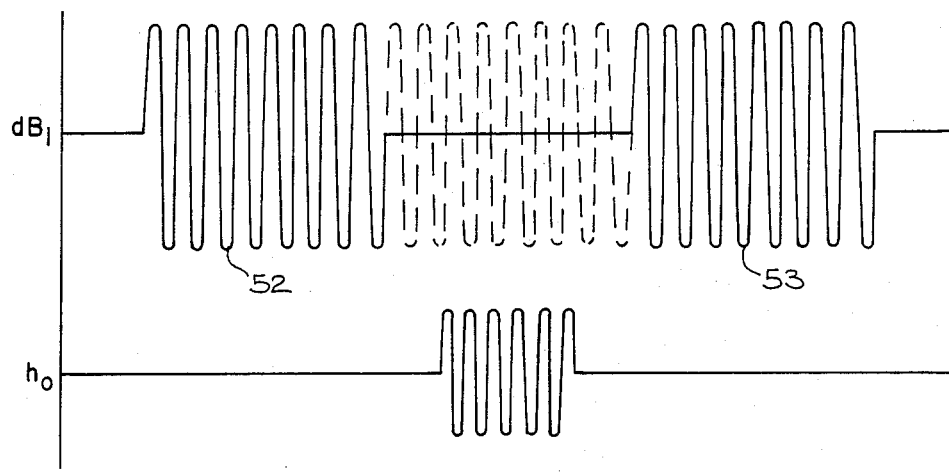
Figure 6B:
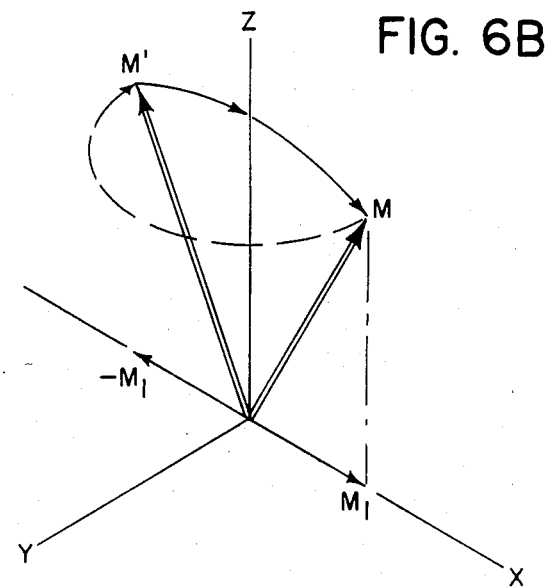

Other bi-phasic motion sensitization fields are possible. Referring particularly to FIGS. 5b and 6b, for example, when a first pulse 52 of excitation field gradient energy is applied the net magnetic moment M is tipped away from the z axis to produce transverse magnetization $M_1$. Now, however, the net magnetic moment is swung around the z axis 180 degrees to produce the net magnetic moment M' which has a transverse magnetic moment $M_1$, which is the same as $M_1$, but reversed in polarity. Such a swing may be accomplished by applying a modulation magnetic field $h_o$ along the z axis, as is well known in the art. Now the net magnetic moment M' is tipped back to the z axis with a second pulse of excitation field gradient energy 53 which has the same phase as the tipping pulse 52. Of course, in this instance any transverse magnetic moment $M_1$ which remains after the bi-phasic sequence indicates flow, but the polarity, or flow direction sensitivity has been reversed in algebraic sign.

It should be apparent to those skilled in the art that other bi-phasic motion sensitization sequences are possible.

I claim:

1. In a gyromagnetic resonance instrument which performs a measurement cycle in which a FID signal produced by gyromagnetic material having a transverse magnetic moment is detected and processed to produce an indication of the amount of transverse magnetization, the improvement comprising:
   an oscillator for producing an excitation signal at the Larmor frequency of the gyromagnetic material;
   an excitation field gradient coil coupled to the oscillator and mounted in the instrument to produce a transversely directed magnetic field at the Larmor frequency which has a magnitude gradient in a preset direction; and
   control means for producing a motion sensitized FID signal by controlling the excitation signal applied to the excitation field gradient coils such that a bi-phasic excitation field gradient is applied to the gyromagnetic material.

2. The improvement as recited in claim 1 in which the instrument includes means for linking the FID signal produced during each of a plurality of measurement cycles with a location in the gyromagnetic material and the control means produces a plurality of motion sensitized FID signals from various locations in the gyromagnetic material which are processed to form an image indicative of the motion of gyromagnetic material at each of said various locations.

3. The improvement as recited in claim 1 in which the bi-phasic excitation field gradient is produced by coupling the excitation signal to the excitation field gradient coil for a preset time interval and then coupling the inversion of the excitation signal to the excitation field gradient coil for the same preset time interval.

4. In an NMR scanner for producing images from data collected during measurement cycles, a method for producing data during such a measurement cycle which indicates motion in gyromagnetic material, the steps comprising:

applying a first bi-phasic excitation field gradient to the gyromagnetic material;
receiving the FID signal which is produced by the gyromagnetic material in response to the first bi-phasic excitation field gradient;
storing the received FID signal;
applying a second bi-phasic excitation field gradient to the gyromagnetic material;
applying a homogeneous transverse excitation field to the gyromagnetic material;
receiving the FID signal which is produced by the gyromagnetic material in response to the homogeneous transverse excitation field; and
storing the received FID signal.

5. The method as recited in claim 4 in which the bi-phasic excitation field gradient is applied to the gyromagnetic material by:
producing a first signal at the Larmor frequency for a preset time interval;
applying said first signal to a gradient coil;
producing a second signal at the Larmor frequency for the same preset time interval; and
applying said second signal to the gradient coil.

6. The method as recited in claim 5 in which the second signal is substantially 180 degrees out of phase with the first signal.

7. The method as recited in claim 4 in which the homogeneous transverse excitation field produces a 90 degree tip in the net magnetic moment of the gyromagnetic material.

* * * * *